United States Patent
Yip et al.

(10) Patent No.: US 9,561,914 B1
(45) Date of Patent: Feb. 7, 2017

(54) APPARATUS AND METHOD FOR TRANSFERRING ELECTRONIC DEVICES

(71) Applicant: ASM Technology Singapore Pte Ltd, Singapore (SG)

(72) Inventors: Shing Kai Yip, Kwai Chung (HK); Yu Sze Cheung, Tuen Mun (HK); Chi Wah Cheng, Tsing Yi (HK)

(73) Assignee: ASM TECHNOLOGY SINGAPORE PTE. LTD, Singapore (SG)

( * ) Notice: Subject to any disclaimer, the term of this patent is extended or adjusted under 35 U.S.C. 154(b) by 0 days.

(21) Appl. No.: 14/881,399

(22) Filed: Oct. 13, 2015

(51) Int. Cl.
| | |
|---|---|
| B65G 47/26 | (2006.01) |
| B65G 47/88 | (2006.01) |
| B65G 27/02 | (2006.01) |
| B65G 47/29 | (2006.01) |
| H05K 13/02 | (2006.01) |

(52) U.S. Cl.
CPC .......... *B65G 47/8884* (2013.01); *B65G 27/02* (2013.01); *B65G 47/295* (2013.01); *H05K 13/02* (2013.01)

(58) Field of Classification Search
CPC ..................................................... B65G 47/52
USPC ................. 198/459.6, 459.7, 530, 531, 533, 434,198/468.4, 471.1
See application file for complete search history.

(56) References Cited

U.S. PATENT DOCUMENTS

| | | | | |
|---|---|---|---|---|
| 5,446,960 A | * | 9/1995 | Isaacs ................. | H05K 13/022 228/180.21 |
| 6,209,194 B1 | * | 4/2001 | Kang ................. | G01R 31/2851 198/438 |
| 6,955,285 B2 | * | 10/2005 | Nomoto .............. | B23K 3/0607 228/214 |

* cited by examiner

*Primary Examiner* — Gene Crawford
*Assistant Examiner* — Lester Rushin
(74) *Attorney, Agent, or Firm* — Ostrolenk Faber LLP

(57) ABSTRACT

An apparatus for conveying electronic devices comprises a track for conveying a plurality of electronic devices in a row towards a pick-up position on the track where the electronic devices are removed by a pick-up device. A guiding portion located over the track has a first restraining mechanism formed in the guiding portion that is operative to restrain and secure a first electronic device at a first position next to the pick-up position and a second restraining mechanism formed in the guiding portion that is operative to restrain and secure a second electronic device at a second position away from the pick-up position which is immediately subsequent to the first position. The first and second electronic devices are configured to be released and conveyed towards the pick-up position when the first and second restraining mechanisms respectively are deactivated. A corresponding method is also provided.

13 Claims, 3 Drawing Sheets

APPARATUS AND METHOD FOR TRANSFERRING ELECTRONIC DEVICES

FIELD OF INVENTION

The present invention relates to the transfer of electronic devices along a track to a pick-up position, particularly in the field of bowl feeders.

BACKGROUND

Vibrational bowl feeders typically hold a supply of electronic devices, and the electronic devices are conveyed from the bowl feeders to other locations along guide tracks linked to the bowl feeders for further processing. Translational motion of the electronic devices along the guide tracks is actuated by vibrating the bowl feeders and guide tracks towards pick-up positions at the end of the guide tracks. Currently, electronic devices fed by vibrational bowl feeders along guide tracks are typically separated by using hard stoppers and/or vacuum suction inlets on the guide tracks for separation of an electronic device at a pick-up position and another electronic device adjacent to it. The separation of the two electronic devices ensures that there is no overlap between them, which may result in jamming or failure to properly pick up the electronic device at the pick-up position.

However, for protruded ball grid array devices which have interconnectors such as solder bumps protruding from one side of the devices, the apparatus has increased difficulty with maintaining separation between the adjacent electronic devices. For instance, the use of hard stoppers is not desirable as the interconnectors are typically not robust enough to sustain a large pressing force which is required to stop the device.

When the solder bumps on the electronic devices are facing downwards on the guide track, a vacuum suction inlet located in the guide track is also ineffective as there will be an incomplete seal from gaps between the protruding interconnectors and the vacuum suction inlet.

Thus, there lacks a solution for separating protruded ball grid array devices on such a guide track next to the pick-up position thereof.

SUMMARY

In a first aspect of the invention, there is provided an apparatus for conveying electronic devices, comprising a track configured for conveying a plurality of electronic devices in a row towards a pick-up position on the track, the electronic devices being configured to be removed from the track at the pick-up position by a pick-up device; a guiding portion located over the track; a first restraining mechanism formed in the guiding portion that is operative to restrain and secure a first electronic device at a first position next to the pick-up position; and a second restraining mechanism formed in the guiding portion that is operative to restrain and secure a second electronic device at a second position away from the pick-up position which is immediately subsequent to the first position. The first and second electronic devices are configured to be released and conveyed towards the pick-up position when the first and second restraining mechanisms respectively are deactivated.

It is preferable that the electronic devices comprise protruded ball grid arrays on one side of the electronic devices, the electronic devices being arranged while on the track with the protruded ball grid arrays facing the track and away from the guiding portion.

Each of the first and second restraining mechanisms can preferably comprise a vacuum suction passage including a vacuum suction inlet formed on a surface of the guiding portion which is operative to attract an electronic device towards the guiding portion. Preferably, a distance between the first and second restraining mechanisms is at least equal to a width of an electronic device along a conveyance direction of the electronic devices.

In addition, the track is preferably configured to undergo vibrational motion for conveying the electronic devices towards the pick-up position.

In another aspect of the invention, there is provided a method for conveying a plurality of electronic devices in a row towards a pick-up position on a track to be removed from the track at the pick-up position by a pick-up device. The method comprises the steps of activating a first restraining mechanism formed in a guiding portion that is located over the track to restrain and secure a first electronic device at a first position next to the pick-up position; activating a second restraining mechanism formed in the guiding portion to restrain and secure a second electronic device at a second position away from the pick-up position which is immediately subsequent to the first position; deactivating the first restraining mechanism such that the first electronic device is released and conveyed towards the pick-up position; and thereafter, removing the first electronic device from the track at the pick-up position.

The method can further comprise the steps of activating the first restraining and deactivating the second restraining mechanism such that the second electronic device is conveyed towards the pick-up position, and the second electronic device is thereafter restrained and secured at the first position by the first restraining mechanism; activating the second restraining mechanism to restrain and secure a third electronic device at the second position; deactivating the first restraining mechanism such that the second electronic device is released and conveyed towards the pick-up position, and thereafter removing the second electronic device from the track at the pick-up position; and vibrating the track to convey the electronic devices towards the pick-up position.

In the method, it is preferable that the electronic devices comprise protruded ball grid arrays on one side of the electronic devices, the electronic devices being arranged while on the track with the protruded ball grid arrays facing the track and away from the guiding portion. It is also preferable that each of the first and second restraining mechanisms comprises a vacuum suction passage including a vacuum suction inlet formed on a surface of the guiding portion, and the vacuum suction inlets attract electronic devices towards the guiding portion for restraining and securing them. In addition, it is preferable that a distance between the first and second restraining mechanisms is at least equal to a width of an electronic device along a conveyance direction of the electronic devices.

DESCRIPTION OF FIGURES

In order that the present invention may be fully understood and readily put into practice, there shall now be described by way of non-limitative example only preferred embodiments of the present invention, the description being with reference to the accompanying illustrative figures, in which:

FIG. 2 is a sequence of views showing a method of using the apparatus in FIG. 1, including.

DESCRIPTION OF PREFERRED EMBODIMENTS

A preferred embodiment of the present apparatus and method provides a bowl feeder that is configured for supplying protruded ball grid array devices. Further details of the preferred embodiment of the apparatus and method will be provided in the following paragraphs.

Figure 1:
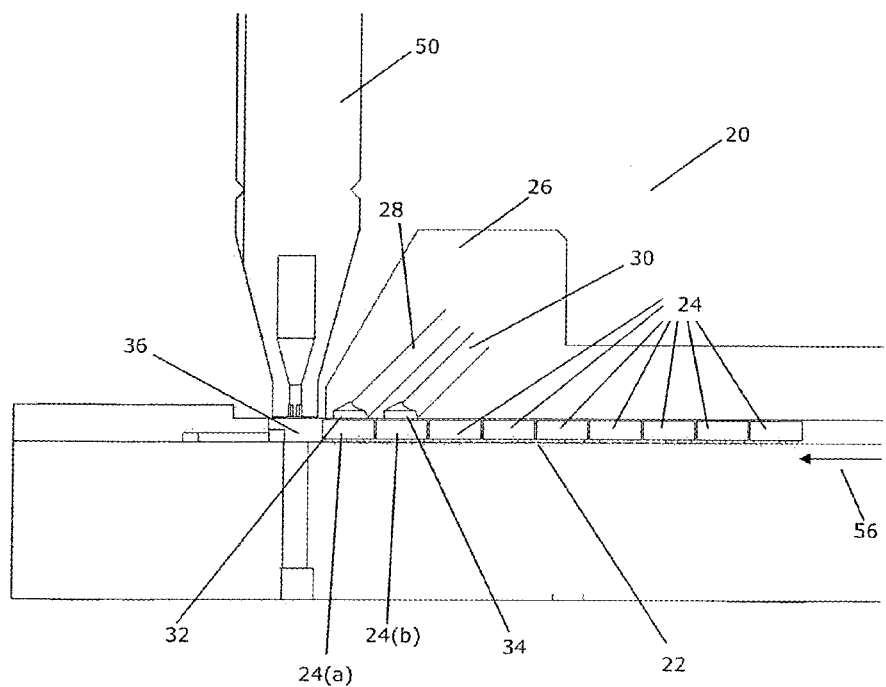
FIG. 1 shows a cross-sectional view of a preferred embodiment of the apparatus.

Referring to FIG. 1, there is provided a preferred embodiment of an apparatus 20 specifically for transferring electronic devices having protruded ball grid arrays on one side of the electronic devices. The electronic devices can include various types of electronic components and packages, and the apparatus 20 is particularly suitable for use with a bowl feeder.

The apparatus 20 comprises a track 22 which is configured for conveying electronic devices 24 that are arranged in a row, wherein a first electronic device 24(a) is located at a front of the row. The apparatus 20 also includes a guiding portion 26 located over the track 22. While on the track 22, the electronic devices 24 are arranged with their protruded ball grid arrays facing the track 22 and away from the guiding portion 26. The guiding portion 26 includes a first restraining mechanism, which may be in the form of a first vacuum passage 28, and a second restraining mechanism, which may be in the form of a second vacuum passage 30, wherein the vacuum passages 28, 30 are defined within the guiding portion 26. The first vacuum passage 28 has a first vacuum inlet 32 on a surface of the guiding portion 26 and the second vacuum passage 30 has a second vacuum inlet 34 on the surface of the guiding portion 26, each vacuum inlet 32, 34 being configured to restrain and secure an electronic device 24 that is being conveyed on the track 22. It should be appreciated that the electronic devices 24 can be restrained and secured onto each of the respective vacuum inlets 32, 34 using suction force.

During the operation of the apparatus 20, a row of electronic devices 24 is automatically conveyed towards a pick-up position 36 in a conveyance direction 56 via vibrational motion of the track 22 to convey the electronic devices 24. When the first vacuum inlet 32 is activated, a first electronic device 24(a) at the front of the row is restrained and secured by the first vacuum inlet 32. When the first vacuum inlet 32 is deactivated, it releases the first electronic device 24(a) so that it may continue to advance to a pick-up position 36 at the end of the track 22. In addition, the suction force at the second vacuum inlet 34 is configured to be deactivated when the first electronic device 24(a) is removed from the pick-up position 36 using a pick-up device such as a collet 50 or any other pick-up mechanism for holding the electronic devices 24. Furthermore, it should be appreciated that a distance between the first and second vacuum inlets 32, 34 is at least equal to a width of an electronic device 24 along the conveyance direction 56. The application of the respective suction forces at the first and the second vacuum inlets 32, 34 to restrain the electronic devices 24 thus ensures a sufficient separation between the first electronic device 24(a) and a second electronic device 24(b) that is immediately subsequent to it to avoid any overlap therebetween.

The operation of the apparatus 20 will now be described with greater detail in the following paragraphs with reference to FIG. 2. It should be appreciated that the operation follows the sequence of FIGS. 2A to 2B to 2C to 2D.

Figure 2A:
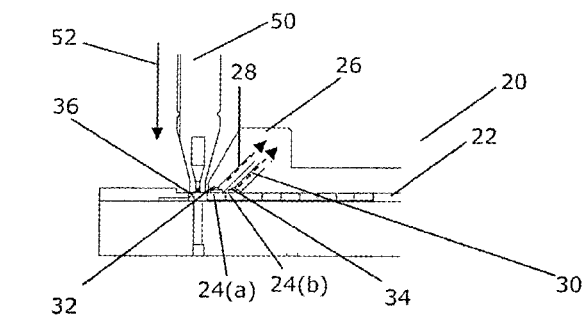
FIG. 2A shows application of suction forces to secure electronic devices at first and second positions.

Referring to FIG. 2A, there is a first position next to the pickup position 36 and a second position away from the pick-up position 36 which is immediately subsequent to the first position. Suction forces (indicated by the arrows with dashed lines towards the guiding portion 26) are applied through the first vacuum inlet 32 and the second vacuum inlet 34 to restrain and secure the first electronic device 24(a) and the second electronic device 24(b) at the first and second positions respectively. In addition, the collet 50 is also shown to be moving towards the pick-up position 36 in a downward direction 52.

Figure 2B:
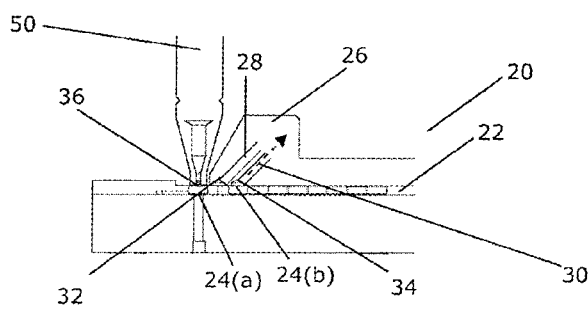
FIG. 2B shows deactivation of suction forces to release a first electronic device to arrange to its pick-up position.

In FIG. 2B, the suction force is deactivated at the first vacuum inlet 32 and this causes the first electronic device 24 to be released so that it may continue to advance from the first position to the pick-up position 36 through vibrational motion of the track 22.

Figure 2C:
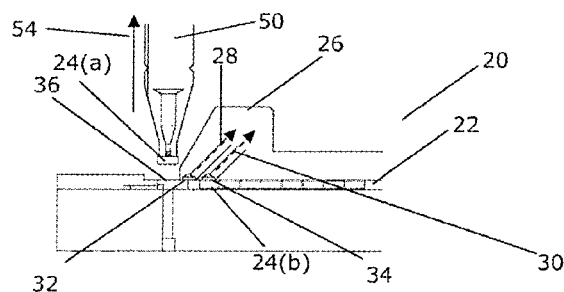
FIG. 2C shows the first electronic device being picked up by a collet while a second device is held by vacuum.

In FIG. 2C, when the first electronic device 24(a) arrives at the pick-up position 36, the first electronic device 24(a) is picked up by the collet 50 and the collet 50 moves in an upwards direction 54 to remove the first electronic device 24(a). The suction force is applied through the first vacuum inlet 32 in order to hold the second electronic device 24(b) in the first position which has been vacated by the first electronic device 24(a).

Figure 2D:
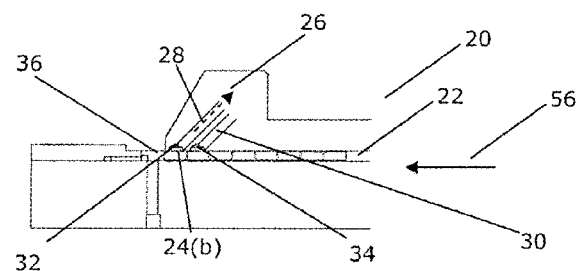
FIG. 2D shows release of suction so that the next electronic device moves to be secured by suction forces.

With reference to FIG. 2D, the suction force has been deactivated in the second vacuum inlet 34, and the row of electronic devices 24 continue to advance in the conveyance direction 56. The second electronic device 24(b) is thus released from the suction force to travel along the track 22 from the second position and is subsequently restrained and secured by the first vacuum inlet 32 (as shown in FIG. 2A) at the first position when it arrives at the first vacuum inlet 32. It should be noted that the second electronic device 24(b) is now separated from another electronic device that is immediately subsequent to it in the row and the operation of the apparatus 20 starts again at FIG. 2A.

While FIG. 2 illustrate the operation of the apparatus 20, there is also provided a method 200 for transferring electronic devices with protruded ball grid arrays, the method 200 being descriptive of the various steps involved in the operation of the apparatus 20, or a similar apparatus according to the invention that may be incorporated with a bowl feeder.

Figure 3:
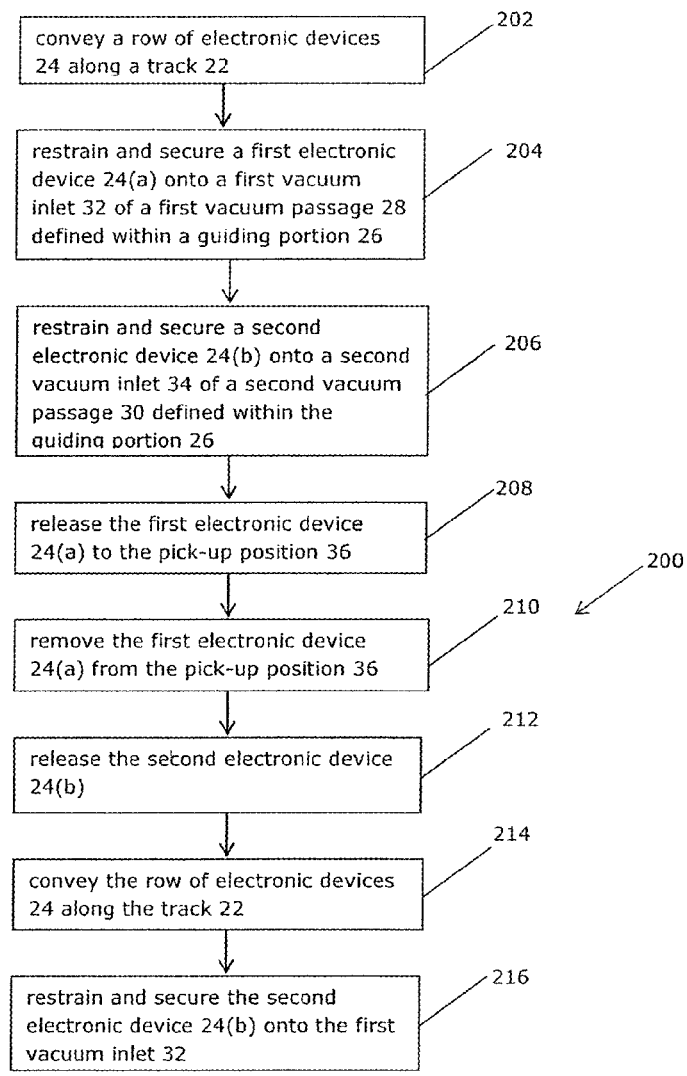
FIG. 3 shows a process flow of the method of FIG. 2.

Referring to FIG. 3, the method 200 comprises conveying a plurality of electronic devices 24 along the track 22 which is below the guiding portion 26 (202). Then, the first electronic device 24(a) of the plurality of electronic devices 24 is restrained and secured onto the first vacuum inlet 32 of the first vacuum passage 28 defined within the guiding portion 26 (204) and the second electronic device 24(b) is also restrained and secured onto the second vacuum inlet 34 of the second vacuum passage 30 as defined within the guiding portion 26 (206). The first electronic device 24(a) is first released so that it may continue to advance to the pick-up position 36 (208) and when the first electronic device 24(a) arrives at the pick-up position 36, it is subsequently removed from the pick-up position 36 (210). Further, the second electronic device 24(b) is then released (212), and the row of electronic devices 24 are conveyed along the track 22 (214) until the second electronic device 24(b) is restrained and secured onto the first vacuum inlet 32 (216). It should be appreciated that the electronic devices are restrained and secured to both the first and the second vacuum inlets 32, 34 using suction force.

The apparatus 20 and the method 200 enable the transfer of electronic devices 24 with protruded ball grid arrays on one side of the electronic devices 24 while facilitating the separation of the electronic devices 24 on the track 22 that is connected to a bowl feeder. Thus the apparatus 20 and the method 200 provide an effective solution for transferring electronic devices 24 to a pick-up position 36, particularly in relation for electronic devices 24 with protruded ball grid arrays.

Whilst there have been described in the foregoing description preferred embodiments of the present invention, it will be understood by those skilled in the technology concerned that many variations or modifications in details of design or construction may be made without departing from the present invention.

The invention claimed is:

1. An apparatus for conveying electronic devices, comprising:
    a track configured for conveying a plurality of electronic devices in a row towards a pick-up position on the track, the electronic devices being configured to be removed from the track at the pick-up position by a pick-up device;
    a guiding portion located over the track;
    a first restraining mechanism formed in the guiding portion and positioned and configured to restrain and secure a first electronic device at a first position on the track next to the pick-up position; and
    a second restraining mechanism formed in the guiding portion and positioned and configured to restrain and secure a second electronic device at a second position on the track, the second position being away from the pick-up position and immediately subsequent to the first position;
    wherein the first and second restraining mechanisms are configured to release the first and second electronic devices and to allow the first and second electronic devices to continue to be conveyed towards the pick-up position when the first and second restraining mechanisms are deactivated.

2. The apparatus of claim 1, wherein the electronic devices comprise protruded ball grid arrays on one side of the electronic devices, the electronic devices being arranged while on the track with the protruded ball grid arrays facing the track and away from the guiding portion.

3. The apparatus of claim 1, wherein each of the first and second restraining mechanisms comprises a vacuum suction passage including a vacuum suction inlet formed on a surface of the guiding portion which is operative to attract an electronic device towards the guiding portion.

4. The apparatus of claim 1, wherein the track is configured to undergo vibrational motion for conveying the electronic devices towards the pick-up position.

5. The apparatus of claim 1, wherein a distance between the first and second restraining mechanisms is at least equal to a width of an electronic device along a conveyance direction of the electronic devices.

6. A method for conveying a plurality of electronic devices in a row towards a pick-up position on a track so as to be removed from the track at the pick-up position by a pick-up device, the method comprising the steps of:
    activating a first restraining mechanism formed in a guiding portion that is located over the track to restrain and secure a first electronic device at a first position on the track next to the pick-up position;
    activating a second restraining mechanism formed in the guiding portion to restrain and secure a second electronic device at a second position on the track, the second position being away from the pick-up position and immediately subsequent to the first position;
    deactivating the first restraining mechanism such that the first electronic device is released and continues to be conveyed towards the pick-up position; and thereafter
    removing the first electronic device from the track at the pick-up position.

7. The method as claimed in claim 6, further comprising the step of activating the first restraining and deactivating the second restraining mechanism such that the second electronic device is conveyed towards the pick-up position, and the second electronic device is thereafter restrained and secured at the first position by the first restraining mechanism.

8. The method as claimed in claim 7, further comprising the step of activating the second restraining mechanism to restrain and secure a third electronic device at the second position.

9. The method as claimed in claim 8, further comprising the step of deactivating the first restraining mechanism such that the second electronic device is released and conveyed towards the pick-up position, and thereafter removing the second electronic device from the track at the pick-up position.

10. The method as claimed in claim 6, wherein the electronic devices comprise protruded ball grid arrays on one side of the electronic devices, the electronic devices being arranged while on the track with the protruded ball grid arrays facing the track and away from the guiding portion.

11. The method as claimed in claim 6, wherein each of the first and second restraining mechanisms comprises a vacuum suction passage including a vacuum suction inlet formed on a surface of the guiding portion, and the vacuum suction inlets attract electronic devices towards the guiding portion for restraining and securing them.

12. The method as claimed in claim 6, further comprising the step of vibrating the track to convey the electronic devices towards the pick-up position.

13. The method as claimed in claim 6, wherein a distance between the first and second restraining mechanisms is at least equal to a width of an electronic device along a conveyance direction of the electronic devices.

* * * * *